US006753579B2

United States Patent
Baba

(10) Patent No.: US 6,753,579 B2
(45) Date of Patent: Jun. 22, 2004

(54) SOI MOSFET DEVICE HAVING SECOND GATE ELECTRODE FOR THRESHOLD VOLTAGE CONTROL

(75) Inventor: Shunsuke Baba, Kanagawa (JP)

(73) Assignee: Oki Electric Industry CO, Ltd., Tokyo (JP)

(*) Notice: Subject to any disclaimer, the term of this patent is extended or adjusted under 35 U.S.C. 154(b) by 0 days.

(21) Appl. No.: 10/425,956

(22) Filed: Apr. 30, 2003

(65) Prior Publication Data
US 2004/0070031 A1 Apr. 15, 2004

(30) Foreign Application Priority Data
Oct. 11, 2002 (JP) ........................................ 2002-298514

(51) Int. Cl.[7] .............................................. H01L 29/78
(52) U.S. Cl. ........................................ 257/365; 257/366
(58) Field of Search ................................ 257/347–351, 257/365, 366, 372

(56) References Cited

U.S. PATENT DOCUMENTS

| | | | |
|---|---|---|---|
| 4,849,366 A | * | 7/1989 | Hsu et al. ................... 438/216 |
| 5,619,054 A | | 4/1997 | Hashimoto ................... 257/347 |
| 5,985,733 A | * | 11/1999 | Koh et al. ................... 438/219 |
| 6,100,567 A | | 8/2000 | Burr ........................... 257/347 |
| 6,383,904 B1 | | 5/2002 | Yu ............................. 257/347 |

FOREIGN PATENT DOCUMENTS

| | | |
|---|---|---|
| JP | 07-106579 | 4/1995 |
| JP | 09-312401 | 12/1997 |
| JP | 10-256560 | 9/1998 |

OTHER PUBLICATIONS

L. Manchanda et al. A High–Performance Directly Insertable Self–Aligned Ultra–Rad–Hard and Enhanced Isolation Field–Oxide Technology for Gigahertz Silicon NMOS/CMOS VLSI. IEEE 1989, pp. 651–658.*

* cited by examiner

Primary Examiner—Wael Fahmy
Assistant Examiner—Anh Duy Mai
(74) Attorney, Agent, or Firm—Rabin & Berdo, P.C.

(57) ABSTRACT

In order to apply a predetermined voltage to a silicon layer (3) to control a threshold voltage, a second gate electrode (5) is provided on the surface of the silicon layer (3) with a gate oxide film (insulating layer) (4) interposed therebetween so as to fall within the same surface of the silicon layer (3) as a surface on which a source (7) and a drain (8) placed in the silicon layer (3) and a first gate electrode (6) are disposed.

6 Claims, 4 Drawing Sheets

SOI MOSFET DEVICE HAVING SECOND GATE ELECTRODE FOR THRESHOLD VOLTAGE CONTROL

BACKGROUND OF THE INVENTION

1. Field of the Invention

The present invention relates to a MOSFET (Metal Oxide Semiconductor Field Effect Transistor) having an SOI (Silicon On Insulator) structure, and particularly to control on variations in threshold voltage.

2. Description of the Related Art

A conventional SOI MOSFET device is provided with a silicon layer, a buried oxide film, and a substrate. A first gate electrode, a gate oxide film, a source, and a drain are formed and disposed on the silicon layer.

Such a device structure has been accompanied by a problem that a threshold voltage varies due to variations in the thickness of the silicon layer within a wafer surface. With a view toward correcting the variations, there has been adopted a method of providing a well electrode made conductive to a well (silicon layer) within the well, modifying a bias voltage applied to the well electrode for each device and varying the potential of the silicon layer to thereby set the threshold voltage to a desired value (e.g., see Japanese Patent Application Laid-Open No. Hei 10(1998)-256560).

Since, however, the bias voltage applied to the well electrode is applied between the drain and the substrate in such a device structure, only about 0.6V could be applied under such a condition that no current flowed out in a forward bias state. Thus, a problem was left behind in that the amount of change in threshold voltage was merely obtained only a little.

With a view to greatly securing the amount of the change in threshold voltage, there has been thus disclosed a method wherein a first gate electrode is provided on an upper surface of a silicon layer with a first oxide film interposed therebetween and a second gate electrode is provided on a lower surface thereof with a second oxide film interposed therebetween, respectively, and a voltage for controlling the threshold voltage is applied to the first gate electrode to thereby input a signal to its corresponding second electrode, or a voltage for controlling the threshold voltage is applied to the second gate electrode to thereby input a signal to its corresponding first electrode, whereby the amount of change in threshold voltage is made great (e.g., see Japanese Patent Application Laid-Open No. Hei 10(1998)-256560).

In addition to the above patent documents, there have been disclosed a technology for providing thin-film SOI MOSFETs whose SOIs or gate oxide films are different in thickness, and providing an electrode electrically insulated from a silicon substrate on the silicon substrate of the specific SOI MOSFET thereof (see Japanese Patent Application Laid-Open No. Hei 7(1995)-106579), a technology for forming a thin-film SOI layer on a silicon substrate with a polysilicon film and a silicon oxide film interposed therebetween and configuring a CMOS circuit by use of the thin-film SOI layer (see Japanese Patent Application Laid-Open No. Hei 9(1997)-312401), etc.

A summary of the technology described in the patent document referred to above will be explained using a drawing.

FIG. 6 is a device structure diagram of a conventional SOI MOSFET.

As shown in the drawing, a silicon layer 102 is provided over a substrate 100 with a buried oxide film 101 formed thereon interposed therebetween. A first gate electrode 104 is provided over a surface of the silicon layer 102, which is located below as viewed in the drawing with a first gate oxide film 103 interposed between the first gate electrode 104 and a channel region in the buried oxide film 101. Further, a second gate electrode 106 is provided over a surface of the silicon layer 102, which is located above as viewed in the drawing with a second gate oxide film 105 interposed between the second gate electrode 106 and a channel region in the surface thereof. In such a semiconductor device, the first gate electrode 104 is driven as an input signal gate and the second gate electrode 106 is driven as for threshold voltage control. Alternatively, the second gate electrode 106 is driven as the input signal gate and the first gate electrode 104 is driven as for the threshold voltage control. Driving them in this way allows an increase in the amount of change in threshold voltage.

Owing to the technology of Japanese Patent Application Laid-Open No. Hei 10(1998)-256560, the problem that the threshold voltage varies due to the variations in the thickness of the silicon layer 102, could be solved by providing the first gate electrode and the second gate electrode in the state of the silicon layer being therebetween as described above, inputting the signal to either one of the gate electrodes and applying the voltage for controlling the threshold voltage to the other gate electrode. Further, the amount of change in threshold voltage could also be greatly ensured.

However, there has been left a problem to be solved that a manufacturing process becomes complex to provide the first gate electrode and the second gate electrode on both sides thereof interposing the silicon layer therebetween, and high-precision processing (polishing or the like) is required.

An object of the present invention is to obtain a device structure capable of avoiding a manufacturing process from becoming complex, and increasing the amount of change in threshold voltage.

SUMMARY OF THE INVENTION

The present invention adopts the following configurations to solve the foregoing.

A first invention provides an SOI MOSFET device characterized in that a second gate electrode is provided on the surface of a silicon layer with an insulating layer interposed between a first gate electrode for a signal input and the silicon layer to apply a predetermined voltage to the silicon layer to thereby control a threshold voltage, in such a manner as to be placed on the same surface of the silicon layer as a surface on which the first gate electrode is disposed.

A second invention provides an SOI MOSFET device characterized in that in the SOI MOSFET device of the first invention, the second gate electrode is provided in plural form.

A third invention provides an SOI MOSFET device characterized in that in the SOI MOSFET device of the second invention, the second gate electrodes are respectively provided at positions to intersect the first gate electrode at both ends of the first gate electrode.

A fourth invention provides an SOI MOSFET device characterized in that in the SOI MOSFET device of the second or third invention, voltages having different values are respectively applied to the respective second gate electrodes.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Preferred embodiments of the present invention will hereinafter be described using specific examples.

SPECIFIC EXAMPLE 1

In the present specific example, a second gate electrode to which a voltage for controlling a threshold voltage is applied, is newly provided over the surface of a silicon layer with a gate oxide film interposed therebetween. The second gate electrode is capacitively-coupled to the silicon layer since the gate oxide film is interposed between the second gate electrode and the silicon layer. Thus, when the dc voltage is applied to the second gate electrode, a positive or negative charge is inducted at a portion near the surface of the silicon layer.

In order to operate such a semiconductor device, a voltage—the device's original threshold voltage plus a voltage for canceling the positive or negative charge must be applied to a first gate electrode for a signal input. As a result, the threshold voltage can be corrected by changing the amount of the positive or negative charge, i.e., the dc voltage applied to the second gate electrode.

Since the dc voltage applied to the second gate electrodes can assume both positive and negative forms, the range of correction of the threshold voltage increases. Further, the second gate electrode is disposed on the same surface of a silicon layer as a surface on which both a source and a drain and the first gate electrode in the silicon layer are disposed. Therefore, there is no need to provide process steps such as turning over of upper and lower surfaces of a silicon wafer, etc. in a manufacturing process. A step for adding the second gate electrode may be added to a normal SOI MOSFT manufacturing process. Thus, complication of the process can be avoided and high-precision processing becomes unnecessary, thus no leading to a substantial increase in cost. Such an SOI MOSFET device is configured in the following manner.

Figure 1:
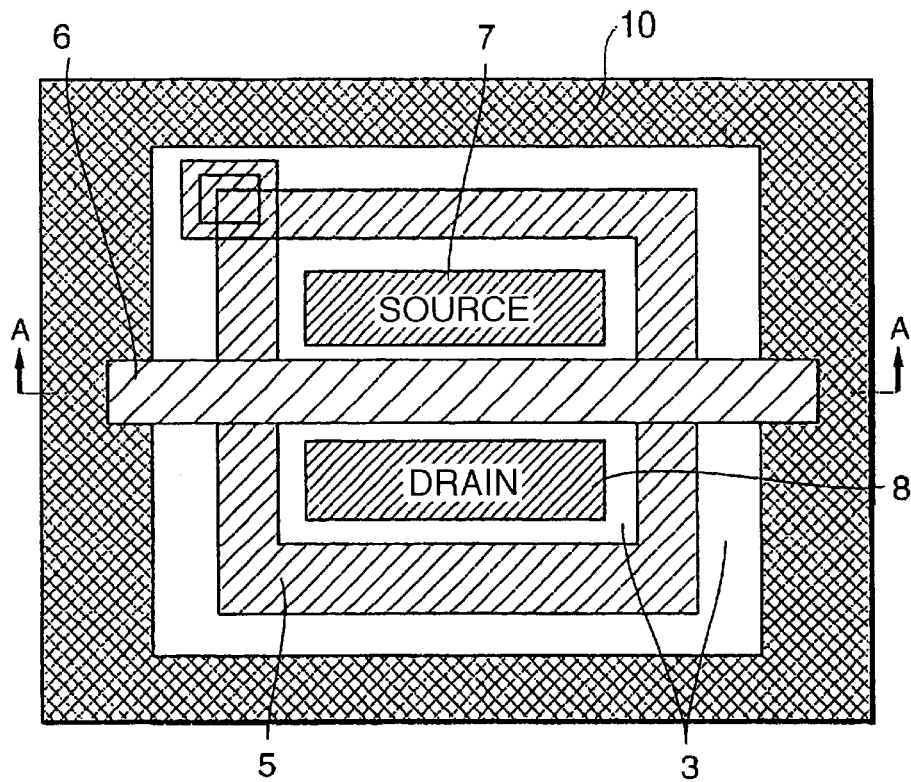
FIG. 1 is a plane view of an SOI MOSFET showing a specific example 1 of an embodiment of the present invention.
Figure 2:
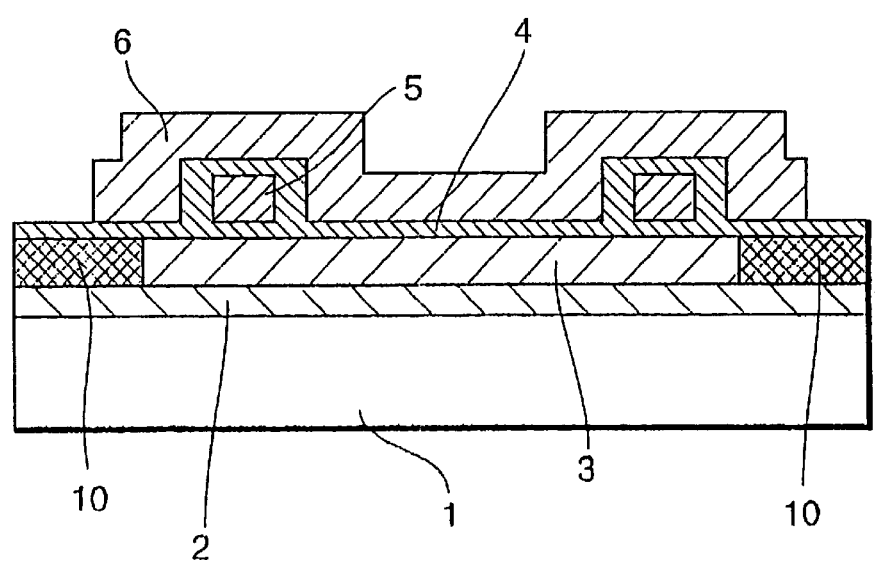
FIG. 2 is a cross-sectional view of the SOI MOSFET illustrating the specific example 1 of the embodiment of the present invention.

FIG. 1 is a plane view of an SOI MOSFET device showing a specific example 1, and FIG. 2 is a sectional structure diagram taken along line A—A in FIG. 1, respectively.

In FIG. 2, the SOI MOSFET showing the specific example 1 has a substrate 1, a buried oxide film 2, a silicon layer 3, a gate oxide film 4, a second gate electrode 5, a first gate electrode 6, a source 7 and a drain 8.

A summary of a method of manufacturing the SOI MOSFET showing the specific example 1 will first be explained.

First, oxygen is ion-implanted in a predetermined position (corresponding to a position where the buried oxide film 2 is formed) of a silicon wafer as viewed its thickness direction. Heat-treating the silicon wafer yields a silicon substrate made up of a substrate 1, a buried oxide film 2 and a silicon layer 3.

Next, the surface of the silicon layer 3 is oxidized to form a gate oxide film 4.

Further, polysilicon or the like used as an electrode member is laminated on the gate oxide film 4, and removed by a photography and etching technology with only a portion to form the electrode member as a second gate electrode being left behind.

According to this process, the corresponding second gate electrode 5 is formed over the silicon layer 3. The second gate electrode 5 is electrically capacitively-coupled to the silicon layer 3 with the gate oxide film 4 interposed therebetween.

Subsequently, the gate oxide film 4 and the CVD oxide is formed on the second gate electrode 5 by a CVD method or the like.

Next, the polysilicon or the like used as the electrode member is laminated on the gate oxide film 4. Further, such an electrode member layer is removed using a photoetching process or the like with only a portion to be formed as a first gate electrode 6 being left behind. According to this process, the first gate electrode 6 is formed on the silicon layer 3.

The first gate electrode 6 is electrically capacitively-coupled to the silicon layer 3 with the gate oxide film 4 interposed therebetween in a state of being insulated from the second gate electrode 5. After such a process, a process perfectly similar to the manufacturing process of the conventional SOI MOSFET is executed.

Namely, a predetermined area is doped with an impurity such as boron or phosphor so that a source 7 and a drain 8 are formed.

Points to keep in mind here are as follows:

In the manufacturing process of the SOI MOSFET illustrative of the present specific example 1, the second gate electrode 5 is formed using the process perfectly identical to the process for forming the first gate electrode 6 before the formation of the first gate electrode 6.

Accordingly, there is no need to execute processes such as turning over of the upper and lower surfaces of the wafer, polishing of its surface, etc. during the manufacturing process.

A control characteristic of the SOI MOSFET showing the specific example 1, which has been fabricated through the processes described above, will be explained.

Figure 3:
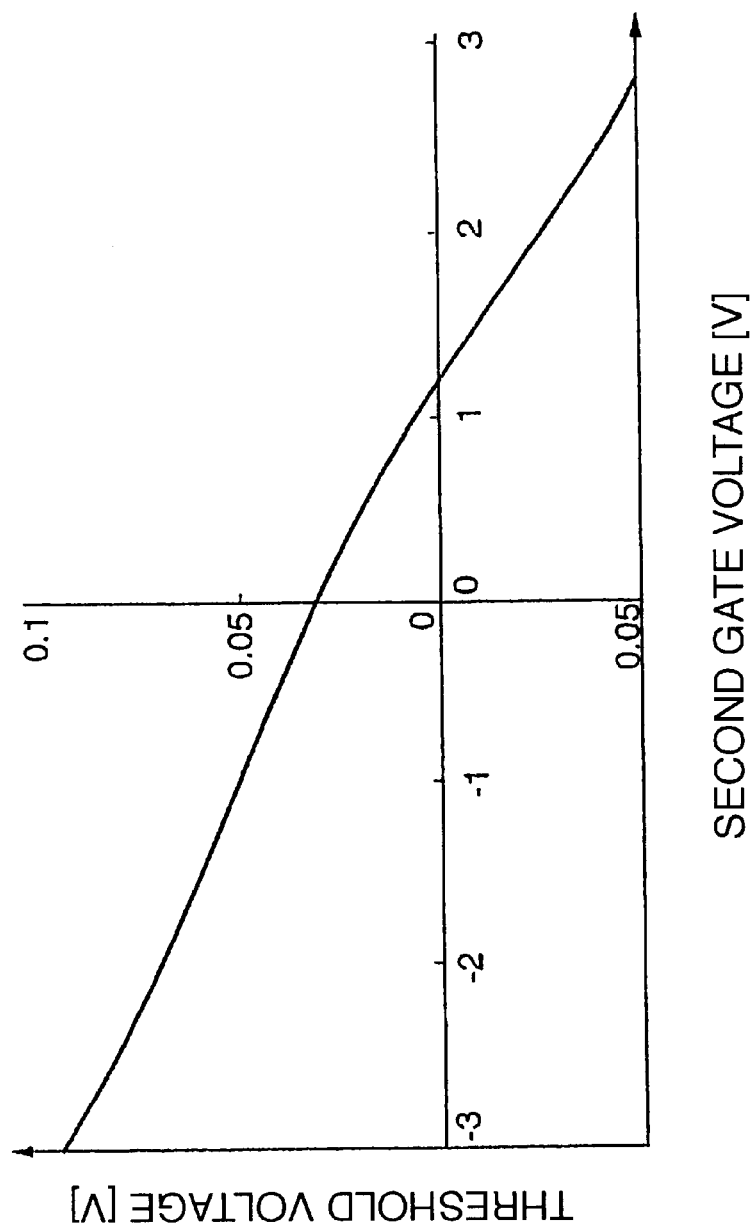
FIG. 3 is a threshold voltage control characteristic diagram of the specific example 1 of the embodiment of the present invention.

FIG. 3 is a control characteristic diagram of a threshold voltage of the specific example 1.

The horizontal axis thereof shows a second gate voltage (V) and the vertical axis thereof represents a threshold voltage (V), respectively.

As described above, the second gate electrode 5 is capacitively-coupled to the silicon layer 3. Namely, a condenser is configured wherein the second gate electrode 5 and the silicon layer 3 are formed as upper and lower electrodes and the gate oxide film 4 used as an insulating material or insulator is interposed therebetween. Thus, when a dc voltage is applied to the second gate electrode 5, a positive or negative charge is induced at a portion near the surface of the silicon layer 3.

The polarity of the induced charge results in inverted polarity of the dc voltage applied to the second gate electrode 5. The value of the dc voltage applied to the second gate electrode 5 is represented on the horizontal axis as the second gate voltage (V). In order to operate the present semiconductor device, a voltage—the device's original voltage plus a voltage for canceling the positive or negative charge induced by the second gate voltage (V) must be applied as plus to the first gate electrode 6. This voltage is represented on the vertical axis as the threshold voltage (V). As shown in the drawing, the threshold voltage drops substantially linearly as the second gate voltage (V) increases. It is understood that when the second gate voltage is changed from −3V to +3V, the threshold voltage is varied by 0.15V in the form of an absolute value. It is understood from this point of view that the SOI MOSFET having the device structure of the specific example 1 is capable of reducing variations in characteristics between devices owing to the application of a predetermined dc voltage to the second gate electrode provided for each device.

However, when the second gate voltage is extremely increased, a leak current starts to flow between the source 7 and the drain 8. Consideration such as the placement of the second gate electrode 5 in the neighborhood of a device isolation region 10 as shown in FIGS. 1 and 2 is required to increase the threshold voltage at which the leak current starts to flow.

Incidentally, according to experiments of the present inventors, inconvenience due to the second gate voltage was not detected in particular within such a measuring range as shown in FIG. 3.

While the second gate electrode 5 is disposed round so as to surround regions for the source 7 and the drain 8 in FIG. 1, the present invention is not limited to such an example. Namely, the second gate electrode 5 may be disposed so as to cross the regions for the source 7 and the drain 8. However, since the first gate electrode 6 is disposed over the second gate electrode 5 at portions where the second gate electrode 5 intersects the first gate electrode 6, it does not function as the first gate electrode 6.

Thus, when the second gate electrode 5 is disposed so as to surround the regions for the source 7 and the drain 8 and cross both ends of the first gate electrode as shown in FIG. 1, the threshold voltage can be controlled most efficiently without deteriorating the function of the first gate electrode 6.

SPECIFIC EXAMPLE 2

Figure 4:
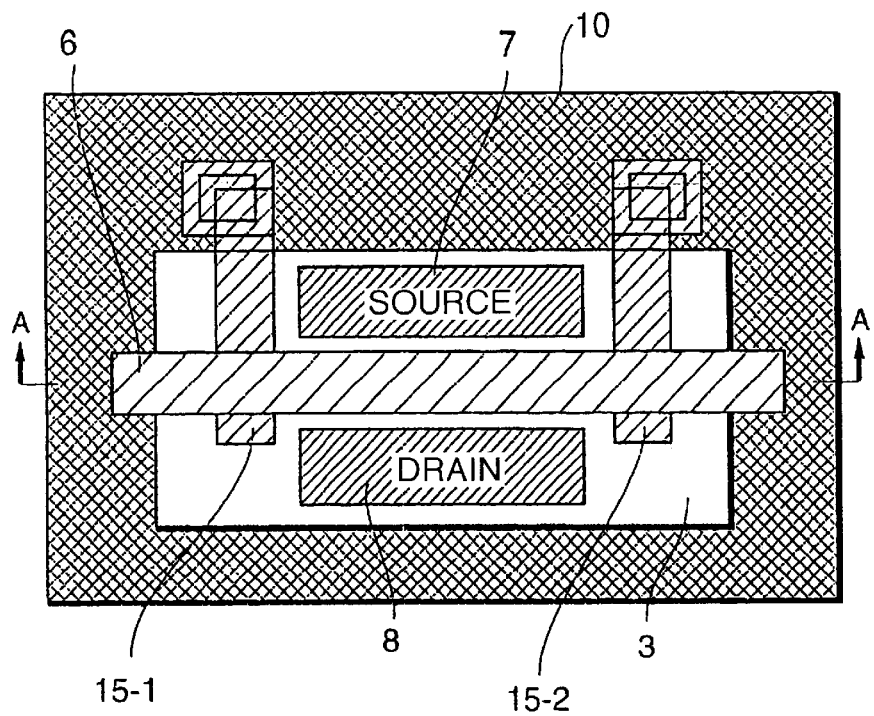
FIG. 4 is a plane view of an SOI MOSFET illustrating a specific example 2 of an embodiment of the present invention.
Figure 5:
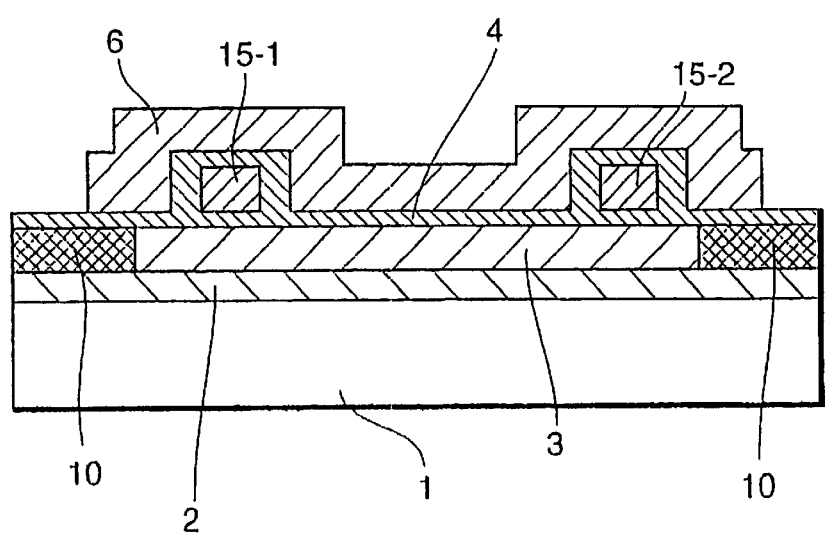
FIG. 5 is a cross-sectional view of the SOI MOSFET showing the specific example 2 of the embodiment of the present invention.
Figure 6:
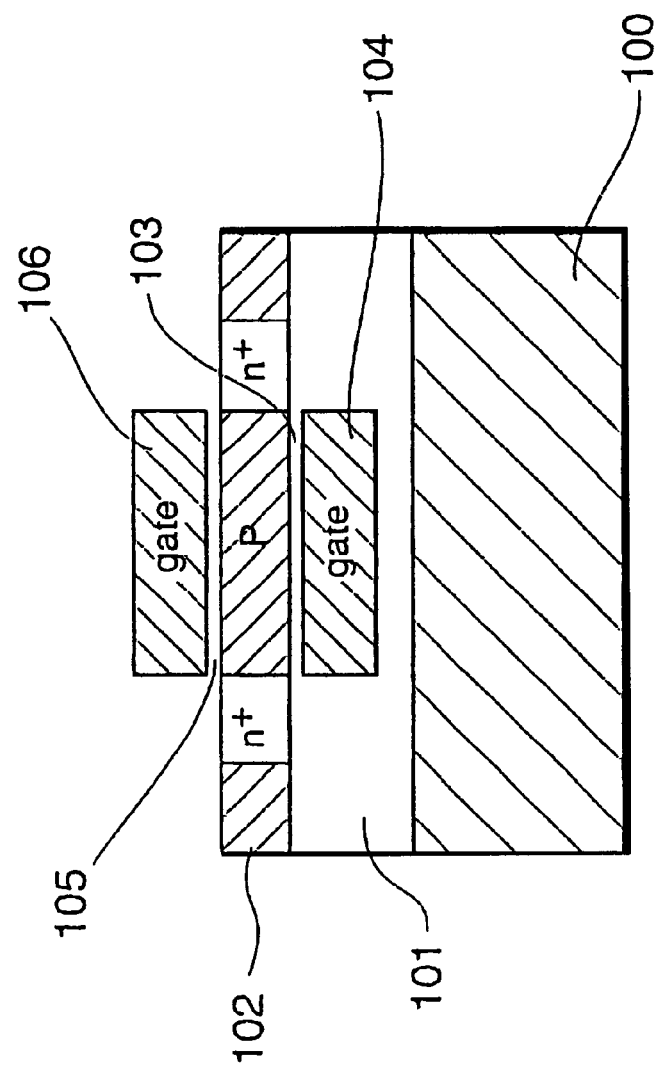
FIG. 6 is a cross-sectional view of an SOI MOSFET according to a prior art.

FIG. 4 is a plane view of an SOI MOSFRT device showing a specific example 2, and FIG. 5 is a sectional structure diagram taken along line A—A in FIG. 4, respectively.

In FIG. 5, the SOI MOSFET showing the specific example 2 has a substrate 1, a buried oxide film 2, a silicon layer 3, a gate oxide film 4, a first gate electrode 6, a source 7, a drain 8, a second gate electrode 15-1, and a second gate electrode 15-2.

Only the difference between the specific example 1 and the specific example 2 will be explained.

In the specific example 1, the second gate electrode 5 surrounds the peripheries of the source 7 and the drain 8.

Further, the second gate electrode 5 intersects the first gate electrode 6 at the two points. On the other hand, in the present specific example, the second gate electrode is divided into two of the second gate electrode 15-1 and the second gate electrode 15-2.

The second gate electrode 15-1 and the second gate electrode 15-2 respectively intersect once on both end sides of the first gate electrode 6. Since other portions are perfectly identical to the specific example 1, their description will be omitted.

Since different voltages are respectively applied to the second gate electrode 15-1 and the second gate electrode 15-2 to thereby make it possible to control a threshold voltage of the specific example 2, the specific example 2 allows a control method to have diversity. The different voltages described herein may be voltages of different polarities as well as voltages having different values.

Owing to the application of the predetermined voltages to the silicon layer, and the provision of the second gate electrodes to control the threshold voltage as described above, the following advantageous effects are obtained:

1. It is possible to avoid complexity of a manufacturing process and increase the amount of change in threshold voltage.

2. It is possible to carry out various control such as control for increasing a threshold voltage during standby of an LSI according to modifications to the threshold voltage to thereby reduce a standby current, control for lowering the threshold voltage during the operation of the LSI to thereby speed up the operation.

3. Further, it is also possible to cause a control method to have diversity owing to the provision of the second gate electrode in plural form.

While the present invention has been described with reference to the illustrative embodiments, this description is not intended to be construed in a limiting sense. Varius modifications of the illustrative embodiments, as well as other embodiments of the invention, will be apparent to those skilled in the art on reference to this description. It is therefore contemplated that the appended claims will cover any such modification or embodiments as all within the true scope of the invention.

What is claimed is:

1. An SOI-structured MOSFET, comprising:
   a first gate electrode for a signal input; and
   a second gate electrode for threshold voltage control, said second gate electrode being insulated from said first gate electrode and being provided on an insulating layer interposed between the first gate electrode and a silicon layer to receive a predetermined voltage which induces a positive or negative charge to the silicon layer to thereby control a threshold voltage, in such a manner so as to be placed above the same surface of the silicon layer as a portion of the first gate electrode,
   wherein the second gate electrode has a plurality of portions, and voltages having different values are respectively applied to different portions of the second gate electrode.

2. The SOI MOSFET according to claim 1, wherein the plurality of portions of the second gate electrode include first and second portions that are respectively provided at positions to intersect the first gate electrode at both ends of the first gate electrode.

3. The SOI MOSFET according to claim 2, wherein voltages having different values are respectively applied to the first and second portions of the second gate electrode.

4. An SOI-structures MOSFET, comprising:

a silicon layer having a main surface;

a first gate electrode to input a signal, the first gate electrode being provided above the main surface of the silicon layer;

a second gate electrode provided above the main surface of the silicon layer, between the silicon layer and the first gate electrode; and an insulating layer formed on the main surface of the silicon layer to insulate the first gate electrode and the second gate electrode from the silicon layer, the second gate electrode additionally being insulated from the first gate electrode, wherein a predetermined voltage is applied to the second gate electrode, the predetermined voltage inducing a negative or positive charge at the main surface of the silicon layer, wherein the second electrode has a plurality of portions, wherein the predetermined voltage is applied to one of the portions, and wherein another redetermined voltage is applied to another of the portions.

5. The SOI MOSFET according to claim 4, wherein the plurality of portions of the second gate electrode include first and second portions that are respectively provided at positions to intersect the first gate electrode and both ends of the first gate electrode.

6. The SOI MOSFET according to claim 5, wherein the predetermined voltage is applied to the first portion of the second gate electrode, and a different predetermined voltage is applied to the second portion of the second gate electrode.

* * * * *